US006750075B2

(12) United States Patent
Razeghi

(10) Patent No.: US 6,750,075 B2
(45) Date of Patent: Jun. 15, 2004

(54) MULTI COLOR DETECTOR

(76) Inventor: Manijeh Razeghi, 1500 Sheridan Rd., Wilmette, IL (US) 60091

( * ) Notice: Subject to any disclaimer, the term of this patent is extended or adjusted under 35 U.S.C. 154(b) by 0 days.

(21) Appl. No.: 10/156,361

(22) Filed: May 28, 2002

(65) Prior Publication Data

US 2002/0195677 A1 Dec. 26, 2002

Related U.S. Application Data

(62) Division of application No. 09/534,234, filed on Mar. 23, 2000, now Pat. No. 6,452,242.
(60) Provisional application No. 60/073,015, filed on Jan. 29, 1998.

(51) Int. Cl.[7] .......................... H01L 21/00; H01L 31/00
(52) U.S. Cl. .................. 438/48; 438/93; 438/94; 438/95; 257/440; 257/441; 257/442; 257/458; 257/461
(58) Field of Search ................. 438/48, 93, 94, 438/95; 257/11, 21, 183, 184, 189, 440–442, 458, 461, 79, 80, 81, 82, 89, 74, 103, 48, 93, 94, 95

(56) References Cited

U.S. PATENT DOCUMENTS

| 5,063,426 A | * 11/1991 | Chandrasekhar et al. ..... 357/30 |
| 5,635,407 A | 6/1997 | Goodwin |
| 5,925,897 A | 7/1999 | Oberman |

FOREIGN PATENT DOCUMENTS

| JP | 3-201571 | 9/1991 |
| JP | 11-186631 | 7/1999 |

* cited by examiner

*Primary Examiner*—Donghee Kang
(74) *Attorney, Agent, or Firm*—Welsh & Katz, Ltd.

(57) ABSTRACT

A heterostructure or multilayer semiconductor structure having lattice matched layers with different bandgaps is grown by MOCVD. More specifically, a wide bandgap material such as AlInSb or GaInSb is grown on a substrate to form a lower-contact layer. An n-type active layer is lattice matched to the lower contact layer. The active layer should be of a narrow bandgap material, such as InAsSb, InTlSb, InBiSb, or InBiAsSb. A p-type upper contact layer is then grown on the active layer and a multi-color infrared photodetector has been fabricated.

19 Claims, 2 Drawing Sheets

Two-color detector structure

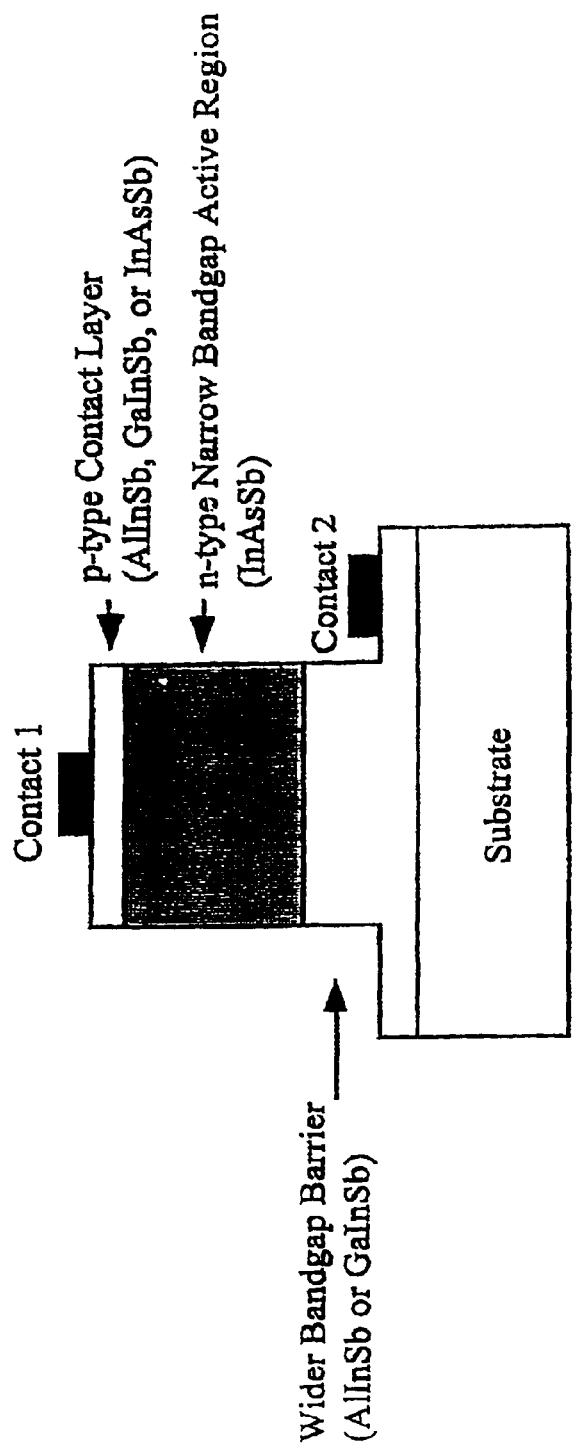
Figure 1    Two-color detector structure

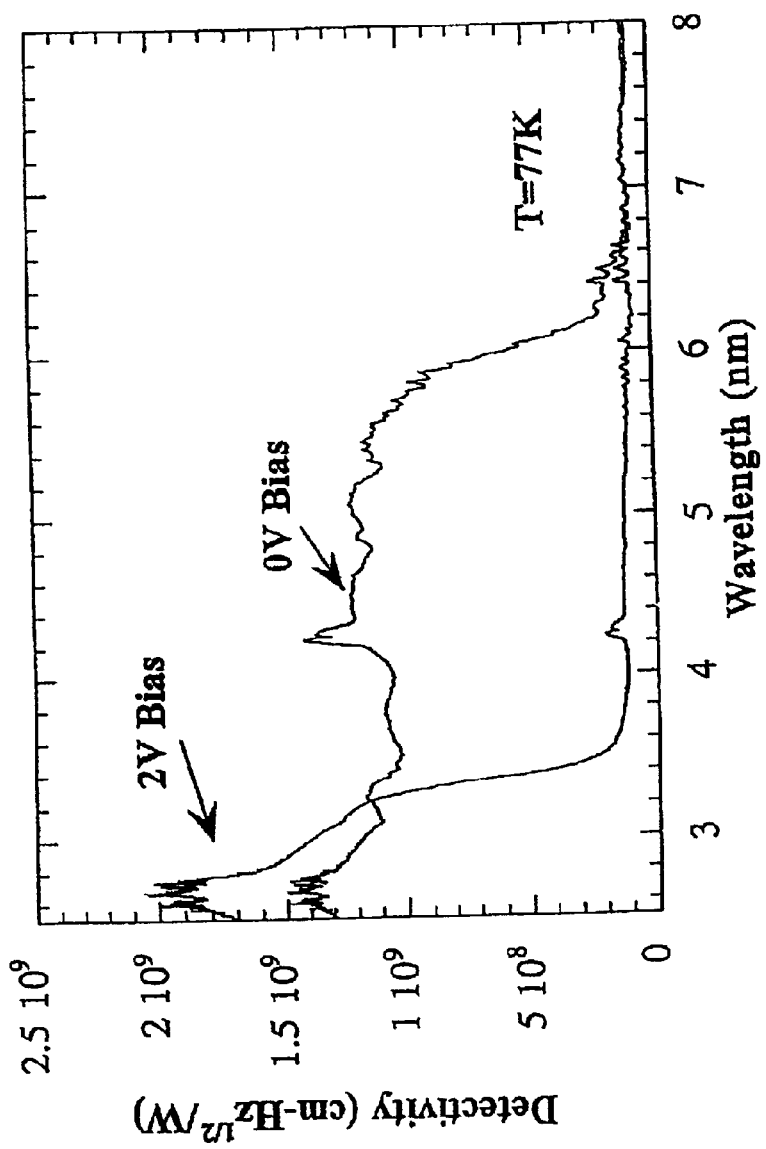
Figure 2  Measured photoresponse from an AlInSb/InAsSb single heterostructure

MULTI COLOR DETECTOR

This application is a divisional of U.S. patent application Ser. No. 09/534,234 on Mar. 23, 2000 now U.S. Pat. No. 6,452,242 which claims benefit of 60/073,015 filed Jan. 29, 1998.

This invention is made with government support under Contract No. DARPA/ONR-N-00014-97-1-0799. The government has certain rights in the invention.

FIELD OF THE INVENTION

This invention relates to semiconductor III-V alloy compounds, as well as to a method of making III-V alloy compounds for use in two color detectors.

BACKGROUND OF THE INVENTION

Infrared (IR) detection is used in many military and commercial applications such as pollution monitoring, night vision, missile tracking, and seeker-tracer systems. The detection of infrared electromagnetic radiation can be accomplished by utilizing either thermal or photon detectors. Photon detectors use narrow bandgap semiconductors, with carriers being generated through the excitement of electron and holes by incident light with energy higher than that of the material bandgap.

Most established infrared imaging systems are single color detectors, meaning that the response of the detector is designed to cover a single region of the IR spectrum. Single color detection is suitable for many applications, but is not adequate for accurate temperature determination or for reliable object identification of objects with unknown emissivities. Two-color detectors are detectors with photoresponse in two separate spectral regions which can eliminate the need for knowing specific object emissivities.

Existing technologies for two-color detection utilize stacked diodes with different active regions which responds to different wavelengths of light, such as superlattices with different well thicknesses and/or band offsets, or by using compound semiconductor materials with different bandgaps. The former method is rather complex, requiring accurate modeling and very large numbers of layers in the structure, and the latter can have the problem of lattice mismatch because of the requirement for different bandgap active regions. The active region could be a ternary or quaternary material, or a superlattice structure. In either case, lattice matching is very important for higher performance detectors, and the fabrication is quite complex. The device is a three terminal device which also adds complexity to the circuitry used to read out the detector electrical signal because of the need for three connections to every pixel.

SUMMARY OF THE INVENTION

These and other objections are attained by the subject invention wherein a heterostructure having lattice matched layers with different bandgaps is grown by MOCVD or like process. More specifically, a wide bandgap material such as AlInSb or GaInSb is grown on a substrate to form a lower-contact layer. An n-type active layer is lattice matched to the lower contact layer and doped. The active layer is a narrow bandgap material, such as InAsSb. A p-type upper contact layer is then grown on the active layer doped and the structure is annealed.

An object, therefore, of the subject invention is a two-color detector.

A further object of the subject invention is a two contact device with a narrow bandgap in an active layer.

DESCRIPTION OF THE DRAWINGS

FIG. 1 is a cross-section of a two-color detector structure according to the subject invention.

FIG. 2 is a graph showing the photoresponse from the two color photodiode of the subject invention.

DETAILED DESCRIPTION OF THE INVENTION

The reactor and associated gas-distribution scheme used herein are substantially as described in U.S. Pat. No. 5,384,151. The system comprises a cooled quartz reaction tube pumped by a high-capacity roughing pump (120 hr-1) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min-1, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The substrate can be GaAs, Si, Al2O3, MgO, SiC, ZnO, LiGaO2, LiAlO2, Cd Te, SiC, InAs, InP, Ga, Sb, InSb, MgAl2O4 or GaN. Preferably, GaAs is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in H2SO4 for 3 minutes with ultrasonic agitation;
2. Rinsing in Deionized H2O;
3. Rinsing in hot methanol;
4. Dipping in 3% Br in methanol at room temperature for 3 minutes (ultrasonic bath);
5. Rinsing in hot methanol;
6. Dipping in H2SO4 for 3 minutes;
7. Rinsing in deionized H2O, and
8. Rinsing in hot methanol.

After this treatment, it is possible to preserve the substrate for one or two weeks without repeating this treatment prior to growth.

Growth takes place by introducing, metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality III-Iv materials may be grown in the method of the subject invention by low pressure metallorganic chemical vapor deposition (LP-MOCVD). Other forms of deposition of III-IV films such as in the subject invention, may be used as well including MBE (molecular beam epitaxy), MOMBE (metalorganic molecular beam epitaxy), LPE (liquid phase epitaxy and VPE (vapor phase epitaxy).

The layers of the heterostructure are grown by an induction-heated horizontal cool wall reactor. Trimethylindium (TMI), Triethylgallium (TEG) and Trimethyl Arsenic (TMAs) are typically used as the sources of Indium, Gallium, and Arsenic, respectively. Trimethyl Aluminum (TMAl) and Trimethyl Antimony (TmSb) are used as sources of Aluminum and Antimony, respectively. Sample is typically grown on a sapphire substrate. A barrier layer of AlInSb or GaInSb is individually laid on the substrate at thicknesses from 50 Å to a few $\mu$m. The doped active layer may be InAsSb doped with an n-type dopant, such as SiH4. The example of optimum growth conditions for the respective layers are listed in Table 1. The confinement of the active layer for the subject invention should be as a heterostructure.

Doping is preferably conducted with bis-cyclopentadienyl magnesium (CP2Mg) for p-type doping and silane (SiH4) for n-type doping. Doping is performed through a BCP2Mg bubbler with H2 as carrier gas and at temperatures from −15° C. to ambient temperatures at 20–1500 cm3 min.-1 and onto either a hot or cooled substrate. Dilute SiH4 may be simply directed at ambient temperatures onto the hot, substrate at 20–90 cm3 min. 1.

Dopants usable in the method of the subject invention are as follows:

| n dopant | p dopant |
|---|---|
| H2Se | (CH3)2Zn |
| H2S | (C2H5)2 Zn |
| (CH3)3Sn | (C2H5)2 Be |
| (C2H5)3Sn | (CH3)2Cd |
| SiH4 | (ηC2H5)2Mg |
| Si2H6 | Cp2Mg |
| GeH4 | |

Codoping with two or more dopants may also be utilized.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that 1020 atoms/cm3 of Mg may be placed on the top surface of the epilayer.

TABLE 1

Optimum growth conditions for representative III-IV materials.

| | AlInSb | GaInSb | InAsSb |
|---|---|---|---|
| Growth Pressure | 76 | 76 | 76 |
| Growth Temperature (° C.) | 500 | 500 | 450 |
| Total H2 Flow (liter/min) | 3 | 3 | 3 |
| TMI (cc/min) | 25 | 25 | 50 |
| TMAs | — | — | 7 |
| TMAl | 3 | — | — |

TABLE 1-continued

Optimum growth conditions for representative III-IV materials.

| | AlInSb | GaInSb | InAsSb |
|---|---|---|---|
| TEGa | — | 4 | — |
| TMSb | 45 | 45 | 40 |
| Growth Rate (Å/min) | 150 | 150 | 250 |

EXAMPLE

The epitaxial layers are grown on (001) GaAs substrates using a horizontal flow low pressure metalorganic chemical vapor deposition (LP-MOCVD) reactor. The inductively heated SiC-coated graphite susceptor is rotated at a speed of ~50–100 rpm to achieve better uniformity films. Trimethylgallium (TMGa) and triethyl-gallium (TEGa) are used as the gallium (Ga) source materials; trimethyl-indium (TMIn) is used as the indium (In) source and Trimethyl Arsenic (TMAs) is used as a source of Arsenic. Trimethyl Aluminum (TMAl) and Trimethyl Antimony (TmSb) is used as the source of Aluminum and Antimony, respectively. Bis-cyclopentadienyl-magnesium (Cp2Mg) and silane (SiH4) are used as the magnesium (Mg) and silicon (Si) doping source materials respectively. The carrier gases include Palladium diffused hydrogen and resin purified nitrogen.

The device structure is shown in FIG. 1. In a preferred embodiment, a thin (.5 $\mu$m to 10 $\mu$m and preferably 5000 Å) AlInSb barrier is grown at low temperature (500° C.) on the GaAs substrate. This layer is not doped. Then, a .1 $\mu$m to 5 $\mu$m and preferably 3 $\mu$m-thick n-doped InAsSb active layer (preferably doped with Si) is grown at 450° C. at a growth rate of 1.5 $\mu$m/hr using TMI, TMAs, TMSb, SiH4 and hydrogen as the carrier gas. The InAsSb layer has a different bandgap than AlInSb, however the respective layers are lattice matched. This layer typically exhibits a room temperature free electron concentration of 2×1018 cm-3 and mobility of 30,000 cm2/Vs. Then, the growth temperature is maintained at 500° C., while 20 growing p-doped AlInSb (preferably doped with Mg) is grown using TMAl, TMIn, TMSb and Cp2Mg at a growth rate of 1.0 $\mu$m/hr, again, lattice-matching the two layers. The sample was then slowly cooled down to avoid formation of cracks. Further, the active layer may be InBiSb, InTlSb, InAsBiSb, or InPBiSb, as well as a multi quantum well of AlSb, InAs and GaSb, or a multi quantum well of AlInSb or GaInSb.

While it is not necessary that the upper contact layer be of the same material as the lower contact layer, it is necessary that each contact layer have a bandgap different from the active layer, while each layer is lattice matched to the adjacent layer.

After epitaxial growth, the wafers are annealed using rapid thermal annealing (RTA) under nitrogen ambient for 30 seconds at 500° C. to achieve low resistivity p-type AlInSb. Typically, the room temperature free hole concentration is 1×1017 cm-3 and mobility is 500 cm2/Vs. Ni/Au metal contacts are deposited on the upper layer of p-type AlInSb using an electron-beam evaporator. Ti/Au metal contacts are then deposited on the lower layer of undoped AlInSb using an electron-beam evaporator. The metal contacts are defined by a conventional lift-off process known in the art.

The structure requires only two contacts and utilizes simple fabrication techniques. With proper control of material composition during the growth of these structures, lattice matched layers with different bandgaps result which leads to detectors with high responsively at two or three wavelength regions. In addition to AlInSb as a barrier material GaInSb may also be used. The resulting photoresponse is shown in FIG. 3. Note that the photoresponse at longer wavelengths changes drastically with an applied bias.

In addition to the structure shown in FIG. 1, a double heterostructure could be used with a wide gap top layer which provides better carrier confinement which leads to better photoresponse, and also could be used for a third wavelength range detection.

A possible third type of structure is an npn (or pnp) phototransistor. This is accomplished by simply alternating the doping of the grown layers to result in a transistor device. The device is still a two terminal device, with base current being supplied by the photogenerated carrier. The main advantage of a phototransistor structure is the possible current gain as a result of transistor action.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A method of preparing a multi color detector device, comprising the steps of:
    a) growing a lower contact layer of AlInSb or GaInSb having a first bandgap on a substrate;
    b) lattice matching and growing a single active layer selected from the group consisting of AlInSb, GaInSb, InTlSb, and InAsBiSb and a multi quantum well of AlSb, InAs and GaSb having a second bandgap different from said first bandgap on said lower contact layer;
    c) lattice matching and growing an upper contact layer having a third bandgap different from said second bandgap on said active layer to form a heterostructure; and
    d) annealing the heterostructure.

2. The method of claim 1, wherein said substrate is GaAs, InP, GaSb, InSb, InAs, Si, $Al_2O_3$, SiC, or CdTe.

3. The method of claim 1, wherein said upper contact layer is p-type doped.

4. The method of claim 1, wherein said active region is n-type doped.

5. The method of claim 1, wherein said upper contact layer is doped with Mg, Be, Zn, Cd, C or codoping.

6. The method of claim 1, wherein said active region is doped with Si, Se Te, Ge, S, or codoped.

7. The method of claim 1, wherein said lower contact layer is about 5 $\mu$m to 10 $\mu$m thick and said active region is about 0.1 $\mu$m to 5 $\mu$m thick.

8. A method of preparing a two color detector device, comprising the steps of:
    a) growing a lower contact layer of AlInSb or GaInSb having a first bandgap on a substrate of GaAs;
    b) lattice matching and growing a single active layer or multiquantum well of AlInSb or GaInSb having a second bandgap different from said first bandgap on said lower contact layer at a temperature of about 450° C.;
    c) doping said active layer with n-type dopant;
    d) lattice matching and growing an upper contact layer having a third bandgap at a temperature of about 500° C. different from said second bandgap on said active layer to form a heterostructure;
    e) doping said upper contact layer with a p-type dopant, and
    f) annealing the heterostructure.

9. The method of claim 8, wherein said upper contact layer is doped with Mg, Be, Zn, Cd, C or is codoped.

10. The method of claim 8, wherein said active region is doped with Si, Se Te, Ge, S, or is codoped.

11. The method of claim 8, wherein said lower contact layer is about .1 $\mu$m to 10 $\mu$m thick and said active region is about .1 $\mu$m to 5 $\mu$m $\mu$m thick.

12. A method of preparing a multi color detector device, comprising the steps of:
    a) growing a lower contact layer having a first bandgap on a substrate;
    b) lattice matching and growing a single active layer selected from the group consisting of InAsSb, GaInSb, InTlSb, InBiSb and InBiAsSb or a multi quantum well of AlSb, InAs, and GaSb having a second bandgap different from said first bandgap on said lower contact layer;
    c) lattice matching and growing an upper contact layer having a third bandgap different from said second bandgap on said active layer to form a heterostructure; and
    d) annealing the heterostructure.

13. The method of claim 12, wherein said upper and lower contact layers are AlInSb or GaInSb.

14. The method of claim 13, wherein said upper contact layer is doped with Mg, Be, Zn, Cd, C or codoping.

15. The method of claim 12, wherein said substrate is GaAs, InP, GaSb, InSb, InAs, Si, $Al_2O_3$, SiC, or CdTe.

16. The method of claim 12, wherein said upper contact layer is p-type doped.

17. The method of claim 12, wherein said active region is n-type doped.

18. The method of claim 12, wherein said active region is doped with Si, Se Te, Ge, S, or codoped.

19. The method of claim 12, wherein said lower contact layer is about 5 $\mu$m to 10 $\mu$m thick and said active region is about 0.1 $\mu$m to 5 $\mu$m thick.

* * * * *